United States Patent
Schnell et al.

(10) Patent No.: US 7,882,324 B2
(45) Date of Patent: Feb. 1, 2011

(54) METHOD AND APPARATUS FOR SYNCHRONIZING MEMORY ENABLED SYSTEMS WITH MASTER-SLAVE ARCHITECTURE

(75) Inventors: Josef Schnell, Charlotte, VT (US); Klaus Hummler, Apex, NC (US); Jong Hoon Oh, Chapel Hill, NC (US); Wayne Frederick Ellis, Jericho, VT (US); Jung Pill Kim, Cary, NC (US); Oliver Kiehl, Charlotte, VT (US); Octavian Beldiman, South Burlington, VT (US); Lee Ward Collins, Cary, NC (US)

(73) Assignee: Qimonda AG, Munich (DE)

( * ) Notice: Subject to any disclaimer, the term of this patent is extended or adjusted under 35 U.S.C. 154(b) by 462 days.

(21) Appl. No.: 11/928,633

(22) Filed: Oct. 30, 2007

(65) Prior Publication Data

US 2009/0113158 A1 Apr. 30, 2009

(51) Int. Cl.
*G06F 12/00* (2006.01)
(52) U.S. Cl. .................... 711/167; 711/5; 709/208
(58) Field of Classification Search ............ 709/208
See application file for complete search history.

(56) References Cited

U.S. PATENT DOCUMENTS

| | | | |
|---|---|---|---|
| 6,434,638 B1 * | 8/2002 | Deshpande | 710/39 |
| 6,647,506 B1 * | 11/2003 | Yang et al. | 713/503 |
| 7,043,657 B1 * | 5/2006 | Yang et al. | 713/503 |
| 2002/0162084 A1 * | 10/2002 | Butts et al. | 716/17 |
| 2003/0154458 A1 * | 8/2003 | Butts et al. | 716/17 |
| 2005/0132158 A1 * | 6/2005 | Hampel et al. | 711/167 |
| 2007/0260906 A1 * | 11/2007 | Corredoura | 713/400 |

FOREIGN PATENT DOCUMENTS

| | | | |
|---|---|---|---|
| EP | 1257059 A2 | * | 11/2002 |
| JP | 61126837 A | * | 6/1986 |
| JP | 10164109 A | * | 6/1998 |

OTHER PUBLICATIONS

Synchronization and Speed-Tracking Logic for Slave-Driven Transfers; IBM Technical Disclosure Bulletin NN9009423; Sep. 1990.*
IEEE Standard 1588; IEEE; Aug. 11, 2002.*
Definition of "delay"; WestNet Learning IT Glossary.*
Definition of "latency"; IEEE Standard Computer Diction A Compilation of IEEE Standard Computer Glossaries.*

* cited by examiner

*Primary Examiner*—Jack A Lane
(74) *Attorney, Agent, or Firm*—Patterson & Sheridan, LLP (57) ABSTRACT

Embodiments of the invention generally provide a system, method and memory device for accessing memory. One embodiment includes synchronization circuitry configured to determine timing skew between a first memory device and a second memory device, and introduce a delta delay to at least one of the first memory device and the second memory device to adjust the timing skew.

25 Claims, 8 Drawing Sheets

METHOD AND APPARATUS FOR SYNCHRONIZING MEMORY ENABLED SYSTEMS WITH MASTER-SLAVE ARCHITECTURE

BACKGROUND OF THE INVENTION

Modern computer systems typically include some form of a memory device which stores information. During system operation, a processor may issue access commands to the memory device to access the stored information. The access commands issued by the processor may include read and write commands. For each received access command, the memory device may process the received access command and use the access command to access a memory array which contains the information stored by the memory device.

Many electronic applications use a set of integrated circuit (IC) chips that are packaged together, for example, on a common printed circuit board (PCB). For example, many applications call for a processor and one or more types of memory, such as volatile memory (e.g., dynamic random access memory, or DRAM) and non-volatile (e.g., flash) memory, to be included on the same PC board. It is sometimes more cost effective to package these integrated circuits together into a single multi-chip package (MCP, which may also be referred to as a multi-chip module, or MCM), that allows tight integration of the devices and occupies less space on a printed circuit (PC) board.

SUMMARY OF THE INVENTION

Embodiments of the invention generally provide a system, method, and memory device for accessing memory. One embodiment includes synchronization circuitry configured to determine timing skew between a first memory device and a second memory device, and introduce a delta delay to at least one of the first memory device and the second memory device to adjust the timing skew. One embodiment of a method of synchronizing a memory enabled system includes receiving, at a first memory device, a first command issued to a first memory device comprising first logic; the first logic comprising command decoding logic and read/write logic; receiving, at the first memory device, a second command issued to a second memory device comprising second logic; the second logic comprising command decoding logic and read/write logic; processing the first command and the second command using the first logic of the first memory device, whereby the second logic of the second memory device is bypassed for purposes of processing the second command; based on the first command, determining a first access delay for the first memory device; based on the second command: (i) initiating a communications exchange between the first memory device and the second memory device; and (ii) determining a second access delay for the second memory device; based on the first access delay and the second access delay, determining a timing skew between the first memory device and the second memory device; and introducing a delta delay to at least one of the first memory device and the second memory device, wherein the delta delay adjusts the timing skew.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Embodiments of the invention generally provide a system, method and apparatus for accessing memory. Further, embodiments of the invention generally relate to memory enabled systems, and, more specifically, to methods and apparatus for implementing memory enabled systems with multiple memory devices using a master-slave architecture.

Packaging multiple processors and multiple memory units together may lead to overall decreased system performance. In some cases, the size and/or complexity of the interfaces may lead to increased input/output (I/O) capacitance, decreased flexibility for density configuration, and increased power consumption. Accordingly, the present embodiments provide methods and apparatus for interfacing integrated circuits in a memory enabled system.

In one embodiment, a system includes a controller configured to output commands, addresses, and data. The system also includes a first volatile memory device configured to input the commands, addresses, and data from the controller via a first port of the first volatile memory device and output the commands, addresses, and data via a second port of the first volatile memory device. The system further includes a second volatile memory device comprising a first port and a second port, wherein the second volatile memory device is configured to receive the commands, addresses, and data via the second port of the second volatile memory device. By accessing the first and second volatile memory device via an interface for the first volatile memory device, access to both memory devices may be simplified. Other embodiments and advantages are also described in greater detail below.

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Also, signal names used below are exemplary names, indicative of signals used to perform various functions in a given memory device. In some cases, the relative signals may vary from device to device. Furthermore, the circuits and devices described below and depicted in the figures are merely exemplary of embodiments of the invention. As recognized by those of ordinary skill in the art, embodiments of the invention may be utilized with any memory device.

Embodiments of the invention may generally be used with any type of memory. In one embodiment, the memory may be a circuit included on a device with other types of circuits. For example, the memory may be integrated into a processor device, memory controller device, or other type of integrated circuit device. Devices into which the memory is integrated may include system-on-a-chip (SOC) devices. In another embodiment, the memory may be provided as a memory device which is used with a separate memory controller device or processor device.

In both situations, where the memory is integrated into a device with other circuits and where the memory is provided as a separate device, the memory may be used as part of a larger computer system. The computer system may include a motherboard, central processor, memory controller, the memory, a hard drive, graphics processor, peripherals, and any other devices which may be found in a computer system. The computer system may be part of a personal computer, a server computer, or a smaller system such as an embedded system, personal digital assistant (PDA), or mobile phone.

In some cases, a device including the memory may be packaged together with other devices. Such packages may include any other types of devices, including other devices with the same type of memory, other devices with different types of memory, and/or other devices including processors and/or memory controllers. Also, in some cases, the memory may be included in a device mounted on a memory module. The memory module may include other devices including memories, a buffer chip device, and/or a controller chip device. The memory module may also be included in a larger system such as the systems described above.

In some cases, embodiments of the invention may be used with multiple types of memory or with a memory which is included on a device with multiple other types of memory. The memory types may include volatile memory and nonvolatile memory. Volatile memories may include static random access memory (SRAM), pseudo-static random access memory (PSRAM), and dynamic random access memory (DRAM). DRAM types may include single data rate (SDR) DRAM, double data rate (DDR) DRAM, low power (LP) DDR DRAM, and any other types of DRAM. Nonvolatile memory types may include magnetic RAM (MRAM), flash memory, resistive RAM (RRAM), ferroelectric RAM (Fe-RAM), phase-change RAM (PRAM), electrically erasable programmable read-only memory (EEPROM), laser programmable fuses, electrically programmable fuses (e-fuses), and any other types of nonvolatile memory.

Figure 1:
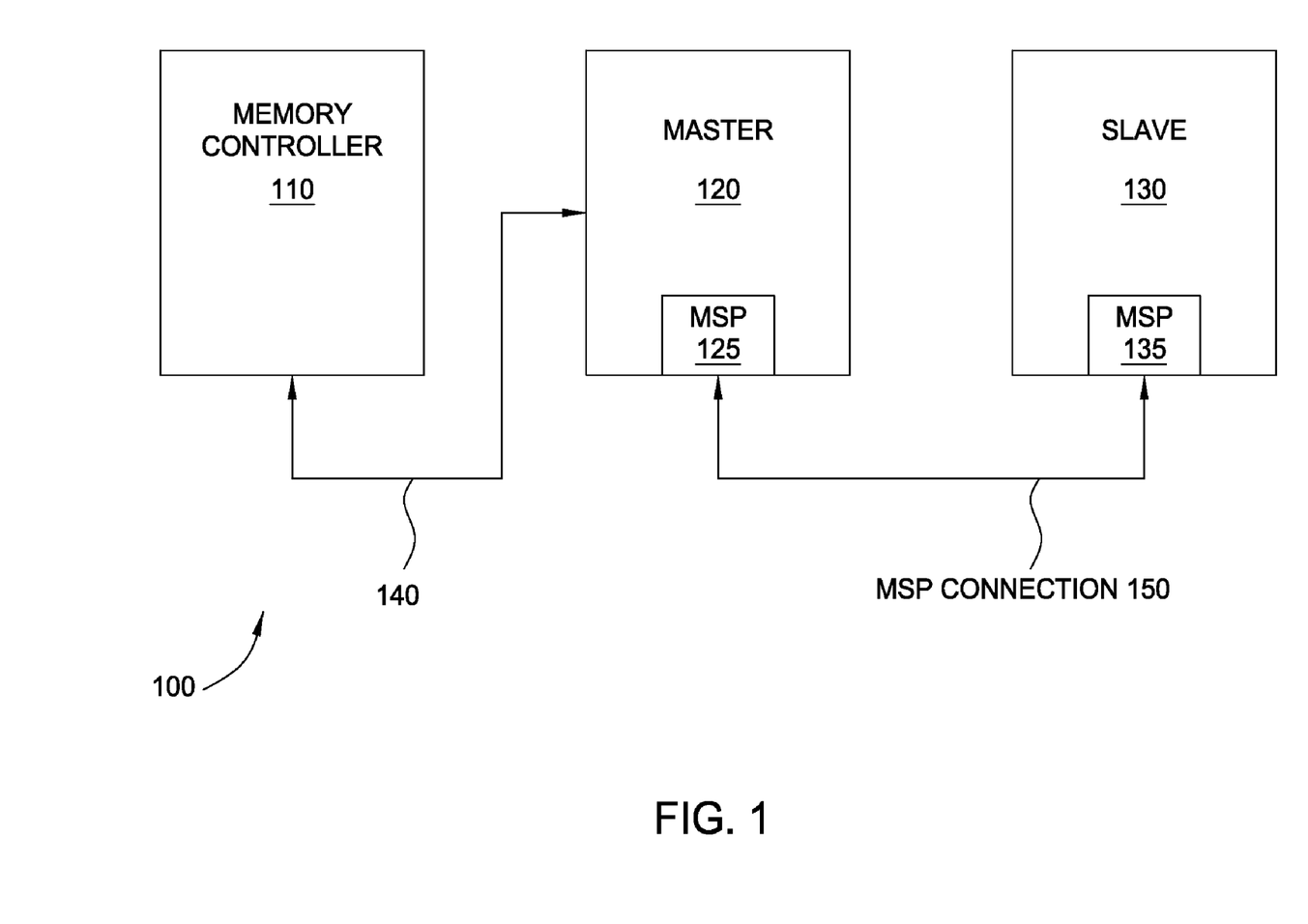
FIG. 1 is a block diagram of a memory enabled system according to one embodiment of the invention.

FIG. 1 is a block diagram depicting a memory enabled system 100 according to one embodiment of the invention. As shown, the system 100 includes a memory controller 110 and two memory devices configured in a master-slave (MS) architecture and shown as a master 120 and a slave 130. In one embodiment, the two memory devices may be, for example, DRAM devices.

The memory controller 110 and the master 120 communicate over a connection 140 that includes a command bus, an address bus, and an input/output (I/O) connection, in one embodiment. In such an arrangement, the memory controller 110 communicates commands to the master 120 over the command bus, addresses to the master 120 over the address bus, and data to the master 120 over the I/O connection. In turn, the master 120 communicates data to the memory controller 110 over the I/O connection.

According to the embodiment shown, the master 120 includes a master-slave port (MSP) 125 and the slave 130 includes an MSP 135. The master 120 and the slave 130 communicate over an MSP connection 150 that includes a command/address (C/A) bus, and an internal data bus, according to one embodiment. In one embodiment, the master 120 may decode the commands, thereby providing decoded commands, and latch the commands and addresses received from the memory controller 110. The master 120 may then communicate the decoded commands and the latched addresses to the slave 130 over the C/A bus, and the latched data to the slave 130 over the internal data connection. In turn, the slave 130 communicates data to the master 120 over the internal data connection. With this configuration, the slave 130 does not communicate with the memory controller 110 directly. Instead, the slave 130 communicates with the master 120 over the MSP connection 150 and exchanges commands, addresses, and data from the memory controller 110 via the master 120. In this fashion, master 120 and the slave 130 share the C/A and I/O connections between the master 120 and the memory controller 110 for communicating commands, addresses, and data.

In one embodiment, both memory devices (i.e., the master 120 and the slave 130) may be fabricated using substantially the same fabrication procedures and contain identical components. Each memory device may be configured to operate as either the master 120 or the slave 130 by bonding options that establish how the memory device operated. For example, the master-slave port of each memory device may include a bond pad connected to a certain voltage indicating whether the memory device is a master 120 or a slave 130. For example, connecting the bond pad of one memory device to a high voltage may identify the memory device as the master 120, while connecting the bond pad of the other memory device to a low voltage may identify the memory device as the slave 130. The components of the master 120 and the slave 130 are now described in greater detail.

Figure 2:
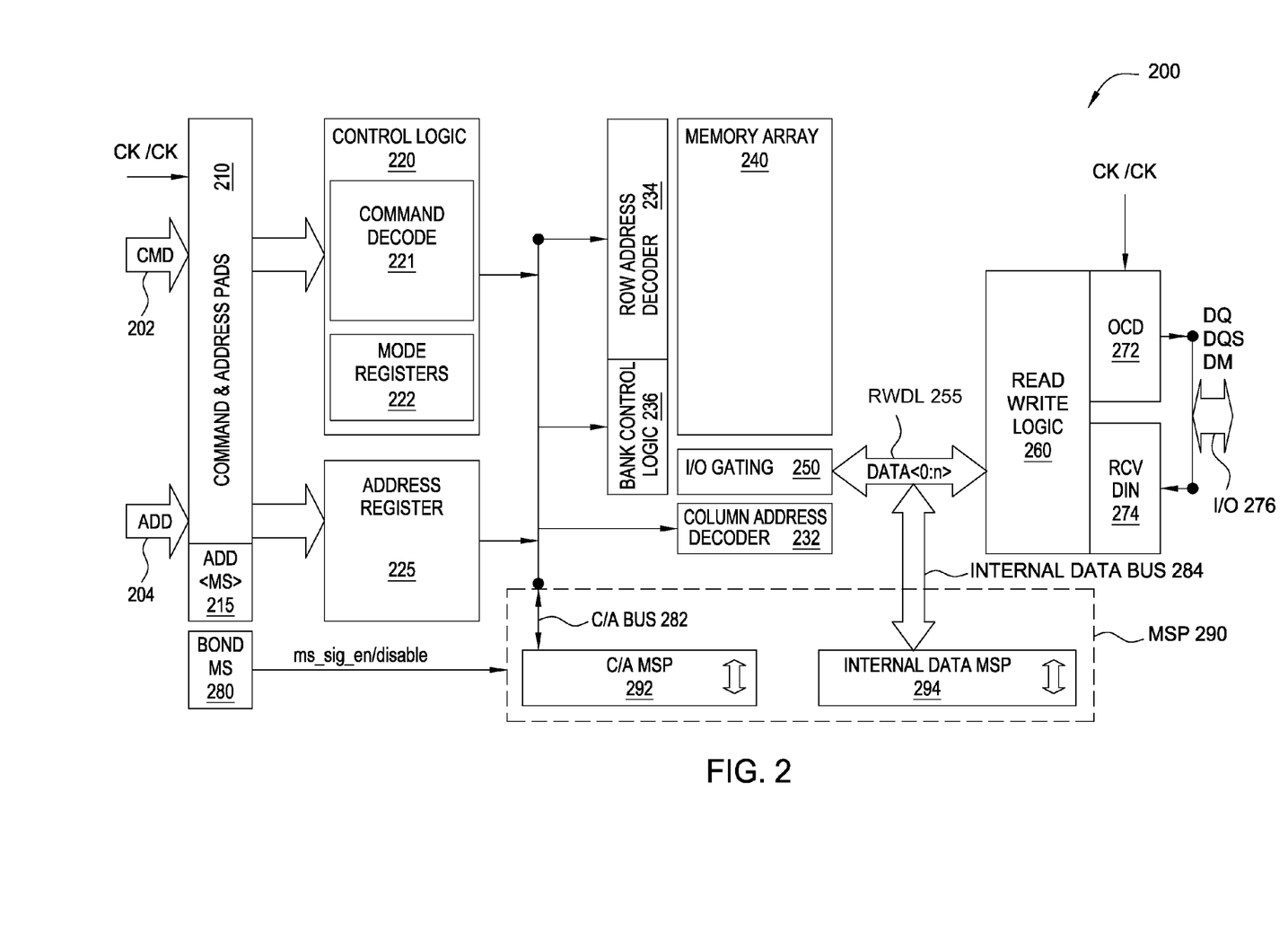
FIG. 2 is a block diagram of a memory device according to one embodiment of the invention.

FIG. 2 is a diagram of a memory device 200 according to one embodiment of the invention. As shown, in one embodiment, the memory device 200 includes command and address pads 210, control logic 220, an address register 225, a column address decoder 232, a row address decoder 234, bank control logic 236, a memory array 240, an I/O gating unit 250, READ/WRITE logic 260, an off-chip driver (OCD) 272, and a unit for receiving data, shown as "RCV DIN 274." As also shown, the memory device 200 includes a MSP 290, a bond pad BOND MS 280, and an additional address pad ADD <MS> 215.

As previously described, the memory device 200 may be configured to operate either as a master (e.g., the master 120 of FIG. 1) or a slave (e.g., the slave 130 of FIG. 1). Where the memory device 200 is configured as a master, the command and address pads 210 connect the memory device 200 to the memory controller. Using the command and address pads 210, the memory controller 110 may communicate commands (shown as "CMD 202" in FIG. 2) and addresses (shown as "ADD 204" in FIG. 2) to the control logic 220 and the address register 225, respectively. As shown, the control logic 220 includes a command decoder unit 221 and mode registers 222. The command decoder unit 221 is configured to decode commands, such as, for example, READ, WRITE, ACTIVATE, MRS (mode register set), and EMRS (extended mode register set) commands. The mode registers 222 are configured to select a mode of the memory device 200.

In one embodiment, the addresses transmitted by the memory controller 110 include an additional address bit that is received via the additional address pad ADD <MS> 215. The additional address bit indicates to the address register 225 whether the memory controller 110 is communicating the commands and addresses (referred to herein as "C/A data") to the memory device 200 to access the master 120 or the slave 130. If the additional address bit indicates that the master 120 is being accessed, then when the C/A data is received, the control logic 220 and the address register 225 provide an internal column address strobe (CAS) and a column address (CA), respectively, to the column address decoder 232. The control logic 220 and the address register 225 also provide control signals, row addresses, and bank information to the row address decoder 234 and the bank control logic 236. When configured as a master, the MSP 290 of the memory device 200 is connected to the respective MSP of a memory device 200 configured as a slave.

Where the memory device 200 is configured as a slave, the command and address pads 210 are not connected to the memory controller 110. Instead, the memory device 200 is connected to another memory device, configured as a master 120, via the MSP 290 (the MSP of the master being connected to the MSP of the slave, according to one embodiment). The MSP 290 includes a port for communicating data related to commands and addresses, shown as a C/A MSP 292, and a port for communicating internal data, shown as an internal data MSP 294. As previously described, the memory controller 110 communicates C/A data to the control logic and the address register of the master 120. The additional address bit ADD <MS> 215 may then indicate to the address register of the master 120 that the C/A data transmitted by the memory controller 110 is intended for the slave 130. In such a case, the control logic 220 and the address register 225 of the master 120 use the C/A data to provide, over a C/A bus 282 connected to the C/A MSP 292, the column address CA and the column address strobe CAS to the column address decoder 232 of the memory device 200 configured as a slave 130. The control logic 220 and the address register 225 of the master 120 also provides, via the C/A MSP 292, control signals, row addresses, and bank information to the row address decoder 234 and the bank control logic 236 of the memory device 200 configured as a slave 130. In this fashion, the control logic 220 and the address register 225 of the memory device 200 configured as a slave 120 may be bypassed and the slave 130 may instead use information from the control logic 220 and the address register 225 of the master 120.

Once the memory device 200 receives the CA, the CAS, the control signals, the row addresses, and the bank information, the column address decoder 232 decodes the CA to generate a column select (CSL) signal. The column address decoder 232, the row address decoder 234, and the bank control logic 236 may then access the memory array 240. When the memory device 200 is configured as a master 120, during an access to the memory array 240, internal data is communicated between the I/O gating unit 250 and the READ/WRITE logic 260 via read/write data lines, shown as RWDL 255. The memory device 200 configured as a master 120 further communicates memory data to and from the memory controller 110 over the I/O connection shown as I/O 276. When, however, the memory device 200 is configured as a slave 130, during an access to the memory array 240, internal data is communicated between the I/O gating unit 250 of the slave memory device 200 and the READ/WRITE logic of the master 120 via an internal data bus 284 connected to the internal data MSP 294. In this fashion, the READ/WRITE logic 260, the OCD 272, and the RCV DIN 274 of the memory device 200 configured as a slave 130 may be bypassed and the slave 130 may instead use the READ/WRITE logic 260, the OCD 272, and the RCV DIN 274 of the master 120.

Figure 3:
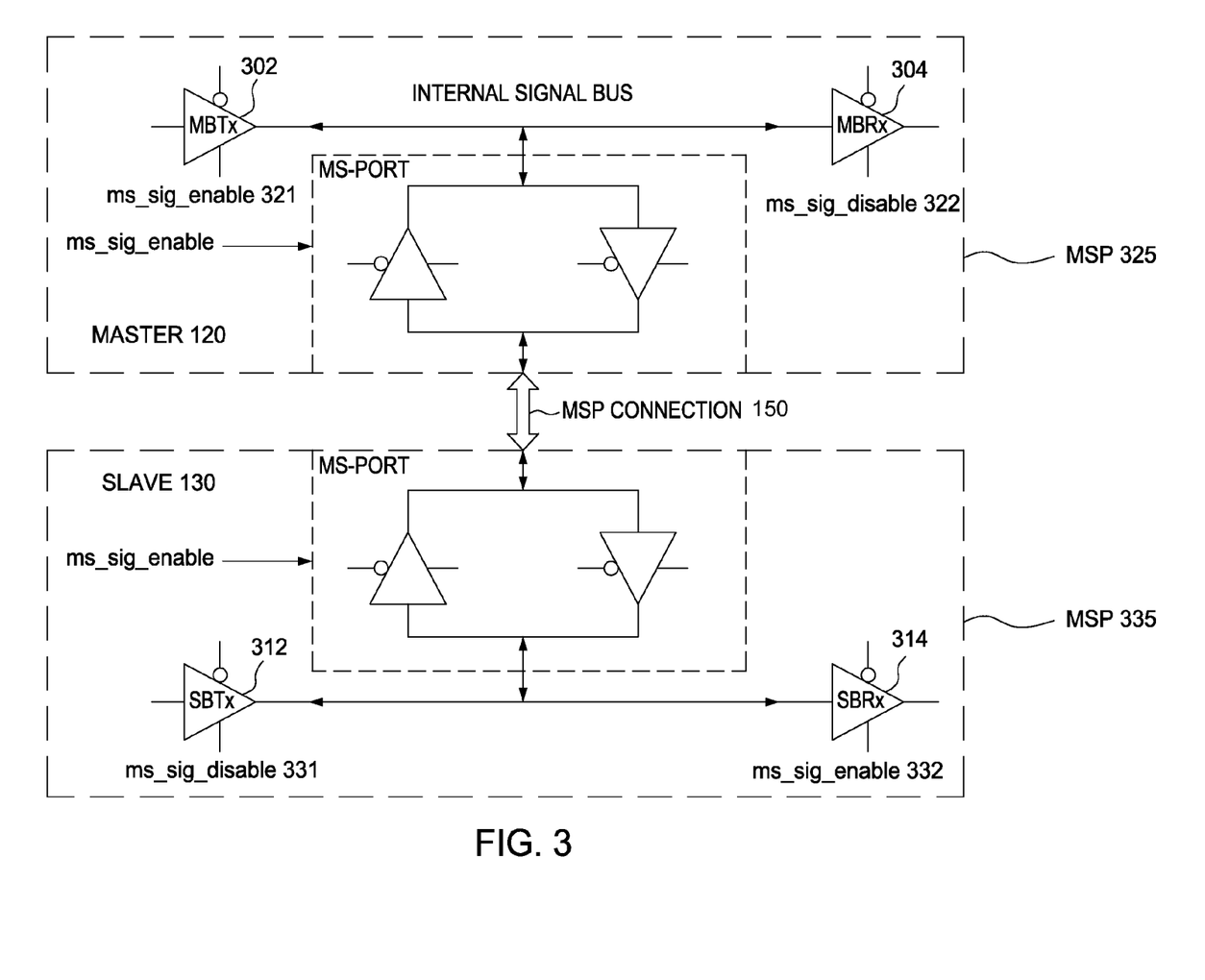
FIG. 3 is a block diagram of the master-slave port configuration for command/address signal according to one embodiment of the invention.

FIG. 3 is a block diagram of the MSP configuration for command/address (C/A) signals according to one embodiment of the invention. For convenience, reference is made to the master 120 and slave 130 (and their respective MSPs) described above with reference to FIG. 1. Thus, the MSP 125 is a master-slave port of the master 120 and the MSP 135 is a master-slave port of the slave 130. The master 120 may communicate with the slave 130 over the bi-directional MSP connection 150 which includes a C/A bus and an internal data bus.

As also shown, the MSP 125 includes a transmit tri-state driver 302 and a receive tri-state driver 304 and the MSP 135 includes a transmit tri-state driver 312 and a receive tri-state driver 314. The tri-state drivers 302, 304, 312, and 314 are used to put data onto (to drive) the same bus (the MSP connection 150), at different times. In order to avoid data contention, a set of control signals ms_sig_enable/disable seek to ensure that only one of the tri-state drivers 302, 304, 312, and 314 is driving a C/A signal at any one time.

In one embodiment, the direction in which C/A signal is transmitted over the MSP connection 150 may be determined based on a control signal provided to the BOND MS pad 280 of a memory device. For example, the bond pad 280 of the master 120 may be connected to a high voltage. In such a case, a tri-state driver MBTX 302 receives a control signal ms_sig_enable 321, which indicates to the MSP 125 of the master 120 that the MSP 125 may transmit C/A signals. In addition, a tri-state driver MBRX 304 receives a control signal ms_sig_disable 322, which indicates to the MSP 125 of the master 120 that the MSP 125 may not receive C/A signals. Similarly, the bond pad of the slave 130 may be connected to a low voltage. In such a case, a tri-state driver SBTX 312 receives a control signal ms_sig_disable 331, which indicates to the MSP 135 that the slave 130 does not transmit C/A signals. In addition, a tri-state driver SBRX 314 receives a control signal ms_sig_enable 332, which indicates to the MSP 135 that the slave 130 may receive C/A signals from the master 120.

Figure 4:
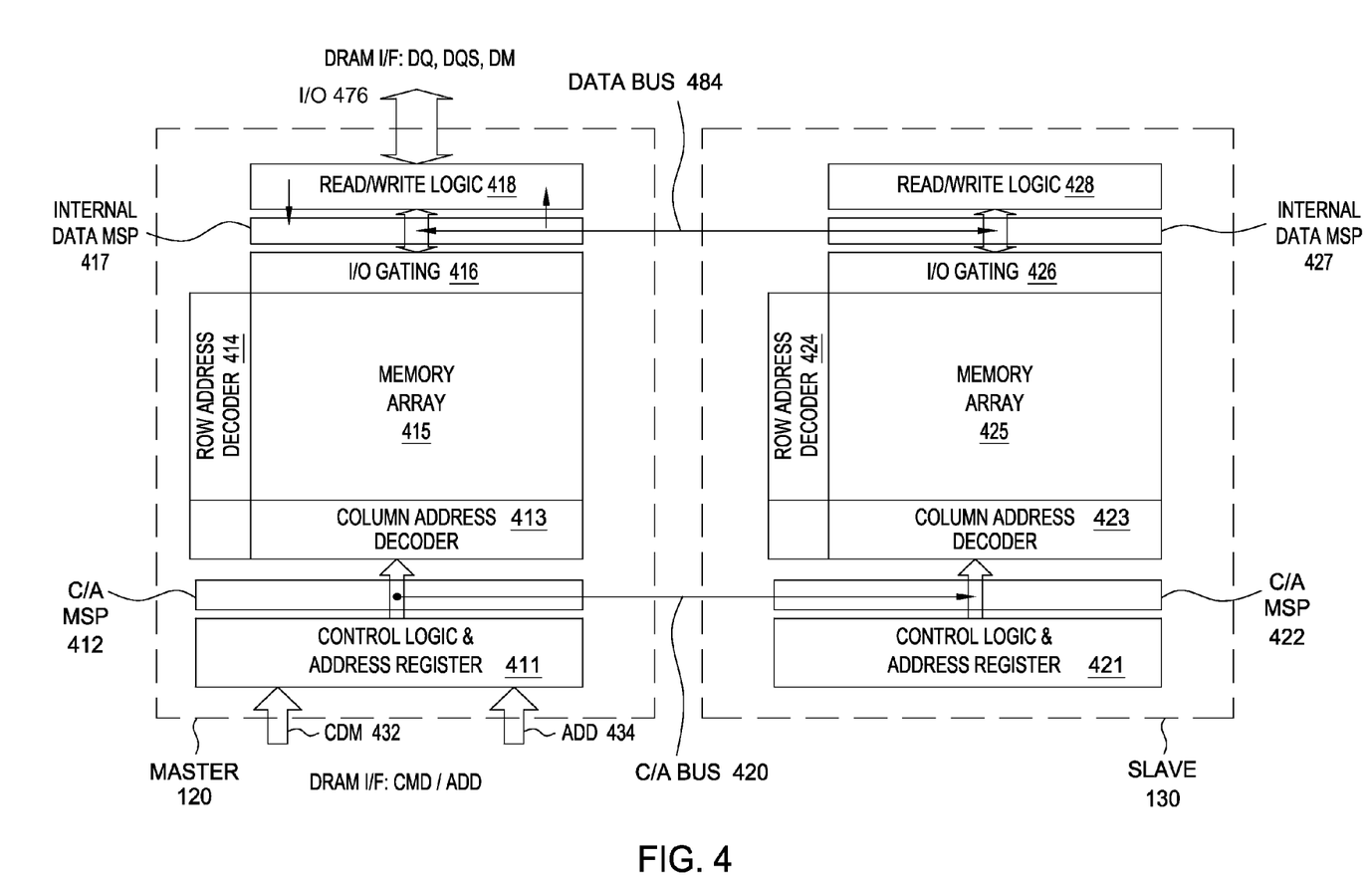
FIG. 4 is a block diagram of two memory devices configured to enable a master-slave architecture according to one embodiment of the invention.

FIG. 4 is a block diagram connections between a master 120 and slave 130 according to one embodiment of the invention. As shown, the master 120 includes control logic and address register unit 411, a C/A MSP 412, a column address decoder 413, a row address decoder 414, a memory array 415, an I/O gating unit 416, an internal data MSP 417, and a READ/WRITE logic 418. Similarly, the slave 130 includes control logic and address register unit 421, a C/A MSP 422, a column address decoder 423, a row address decoder 424, a memory array 425, an I/O gating unit 426, an internal data MSP 427, and a READ/WRITE logic 428. However, as previously described herein, the C/A and I/O connections of the master 120 are bonded to the memory controller 110, while the C/A and I/O connections of the slave 130 are not bonded to the memory controller 110. The C/A connections from the memory controller 110 to the master 120 are shown in FIG. 4 as a command bus CMD 432 and an address bus ADD 434. The I/O connections between the master 120 and the memory controller are shown in FIG. 4 as a connection I/O 476.

As previously described, with such a configuration, the memory controller 110 communicates C/A data to the control logic and address register unit 411. While C/A data issued by the memory controller 110 may be related to either the master 120 or the slave 130, the C/A data is received by the control logic and address register unit 411 of the master 120. Based on the additional address bit ADD <MS> 215, the address register of the master 120 determines whether the memory controller 110 is communicating the C/A data to the master 120 or the slave 130. When the memory controller 110 is communicating the C/A data to the master 120, the control logic and address register 411 provides the CA and the CAS to the column address decoder 413. When, however, the memory controller 110 is communicating the C/A data to the slave 130, the control logic and address register 411 transmits the CA and the CAS, over the C/A bus 420, from the C/A MSP 412 to the C/A MSP 422. The C/A MSP 422 then provides the CA and the CAS to the column address decoder 423.

When the memory controller 110 is communicating with the master 120, the column address decoder 412 uses the CA and the CAS to access the memory array 415. During an access to the memory array 415, internal data is communicated between the I/O gating unit 416 and the READ/WRITE logic 418. The READ/WRITE logic 418 is configured to transmit and receive data to and from the memory controller 110 over the I/O 476. In one embodiment, the READ/WRITE logic 418 may be configured to read data into a queue within the master 120, such as, for example first in, first out (FIFO) queue, before transmitting the data to the memory controller 110 over the I/O 476.

When the memory controller 110 is communicating with the slave 130, the column address decoder 423 uses the CA and the CAS to access the memory array 425. During an access to the memory array 425, via the internal data MSP 427 and the internal data MSP 417, internal data is communicated from the slave 130 to the controller 110 via the master 120 with data being transferred between the I/O gating unit 426 of the slave 130 and the READ/WRITE logic 418 of the master 120 over the data bus 484.

In this fashion, the control logic and address register 411 and the READ/WRITE logic 418 of the master 120 is shared between the master 120 and the slave 130, while the control logic and address register 421 and the READ/WRITE logic 428 of the slave 130 is bypassed. As a result, the power consumption of a multi-chip package that includes memory devices in a master-slave architecture may be reduced, according to one embodiment. Furthermore, according to one embodiment, the system performance may be increased because the I/O capacitance is reduced when the master 120 is bonded to the memory controller 110 but the slave 130 is not.

In a master-slave architecture described above, process, voltage, and temperature (PVT) variations between the master 120 and the slave 130 may lead to a timing skew on the shared C/A and I/O data buses between the master 120 and the slave 130. In some cases, the timing skew may prevent the master 120 and the slave 130 from successfully sharing commands, addresses, and data. Embodiments of the invention provide a method and apparatus for synchronizing operations in the master 120 and the slave 130 so that the master 120 and the slave 130 may successfully share commands, addresses, and data as described above.

Figure 5A:
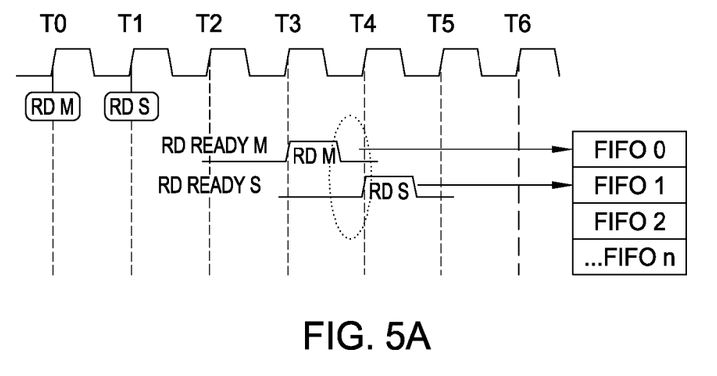
FIGS. 5A and 5B is a timing diagram illustrating the effects of timing skew between a master and a slave according to one embodiment of the invention.
Figure 5B:
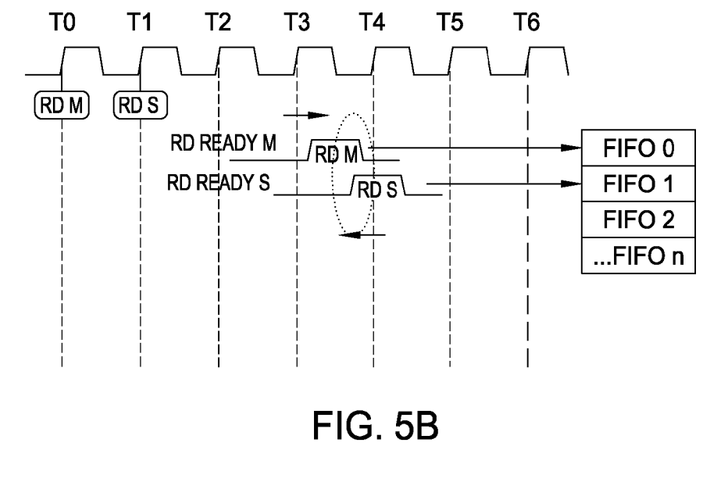

FIGS. 5A and 5B illustrate the effects of the timing skew between a master 120 and a slave 130, in one embodiment. More specifically, FIG. 5A illustrates an operation in which no skew occurs and FIG. 5B illustrates a skewed operation. As depicted, the memory controller 110 issues a READ command to read from a first address within the master 120 at a clock cycle T0, denoted "RD M" in FIGS. 5A and 5B. During the next clock cycle T1, the memory controller issues a READ command to read from a second address within the slave 130, denoted "RD S" in FIGS. 5A and 5B. As previously described herein, the READ command RD M and the first address are transmitted over the connections CMD 432 and ADD 434 to the control logic and address register unit 411 within the master 120.

The master 120 processes the READ command RD M as described above, and, at a clock cycle T3 asserts a READ READY signal (shown as "RD READY M" signal in FIGS. 5A and 5B). The RD READY M signal indicates to the READ/WRITE logic 418 that the master 120 read the data from the first address and is ready to place the read data into a queue within the READ/WRITE logic 418. Further, the RD READY M instructs the queue within the READ/WRITE logic 418 that the queue should latch the data coming from the master 120 to FIFO 0.

Similarly, the READ command RD S and the second address are transmitted over the connections CMD 432 and ADD 434 to the control logic and address register unit 411 within the master 120. The master 120 then passes the READ command RD S and the second address, over the C/A bus 482 of the MSP connection, to the slave 130. The slave 130 processes the READ command RD S and, at a clock cycle T4, the slave 130 asserts a READ READY signal (shown as "RD READY S" signal in FIGS. 5A and 5B), over the data bus 484 of the MSP connection. The RD READY S signal indicates to the READ/WRITE logic 418 of the master 120 that the slave 130 read the data from the second address and is ready to place the read data into the queue within the READ/WRITE logic 418. Further, the RD READY S instructs the queue within the READ/WRITE logic 418 that the queue should latch the data coming from the slave 130 to FIFO 1.

An access delay associated with a memory device is the difference between the time when the memory device receives a READ command and the time when the memory device asserts a READ READY signal. The access delays for the master 120 and the slave 130 described above, denoted as MASTER DELAY and SLAVE DELAY, respectively, may be determined as follows:

$$\text{MASTER DELAY} = T_3 - T_0 = 1 * tD \quad (1)$$

$$\text{SLAVE DELAY} = T_4 - T_1 = 1 * tD \quad (2)$$

where tD is the nominal READY access time.

As shown with (1) and (2), the access delay of the master 120 is equal to the access delay of the slave 130. Consequently, the timing skew, which may be calculated as the difference between the access delays of the master 120 and the slave 130, is zero, meaning that the master 120 and the slave 130 are synchronized in accessing the queue and sending data to the I/O data bus. As a result, there is no data contention on the shared I/O data bus and no data contention within the queue within the master 120.

In some cases, as depicted in FIG. 5B, the master 120 is slow relative to the slave 130. For example, the master 120 may assert a RD READY M signal at time T3, late, which is later than the clock cycle T3 (e.g., 0.2*tD later than T3). The slave 130 may assert a RD READY S signal at time T4, early, which is earlier than the clock cycle T4 (e.g., 0.1*tD earlier than T4). As a result, there may be an overlap between the two READ READY signals on the shared I/O data bus as both memory devices are trying to communicate data to the memory controller 110. The access delays for the master 120 and the slave 130 may be determined as follows:

$$\text{MASTER DELAY} = T_3 - T_0 = 1.2 * tD \quad (3)$$

$$\text{SLAVE DELAY} = T_4 - T_1 = 0.9 * tD \quad (4)$$

As shown with (3) and (4), the access delay of the master 120 is not equal to the access delay of the slave 130, which indicates that the master 120 and the slave 130 are not synchronized. The timing skew between the master 120 and the slave 130 is not zero, which may lead to data contention on the shared I/O data bus and in the queue of the master 120.

Figure 6:
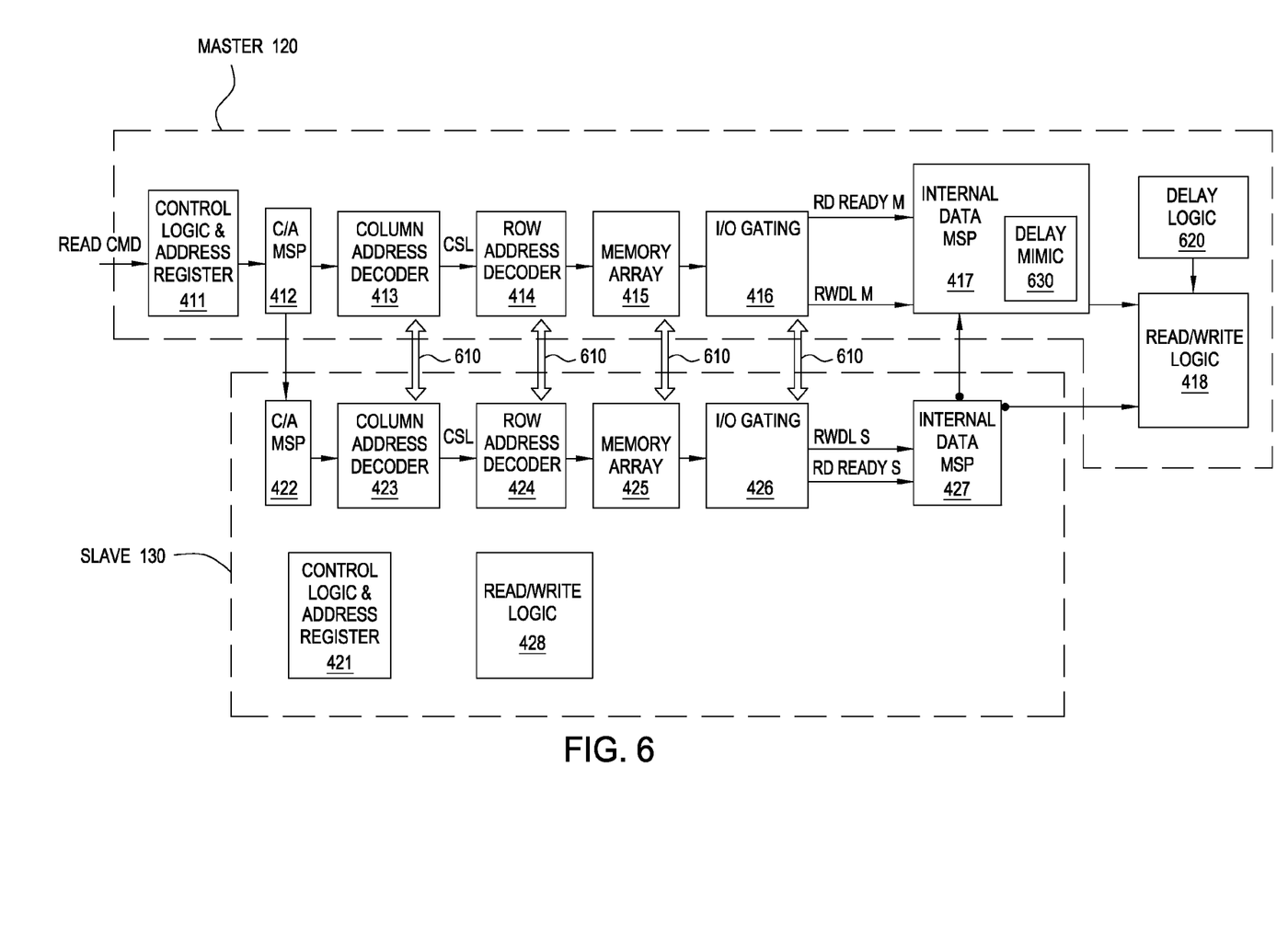
FIG. 6 is a block diagram illustrating the data flow within two memory devices in a master-slave architecture configured to eliminate the timing skew for a READ operation according to one embodiment of the invention.

FIG. 6 illustrates the data flow within the master-slave architecture according to one embodiment of the invention. As shown, the master 120 includes the control logic and address register unit 411, the C/A MSP 412, the column address decoder 413, the row address decoder 414, the memory array 415, the I/O gating unit 416, and the READ/WRITE logic 418, as described in FIG. 4. As shown, the slave 130 includes the control logic and address register unit 421, the C/A MSP 422, the column address decoder 423, the row address decoder 424, the memory array 425, the I/O gating unit 426, the internal data MSP 427, and the READ/WRITE logic 428, as described in FIG. 4.

As shown with arrows 610, PVT variations introduced to the column address decoders 413, 423, the row address decoders 414, 424, the memory arrays 415, 425, and the I/O gating units 416, 426 may lead to the master 120 and the slave 130 having different access delays. As previously described herein, different access delays result in timing skew that may lead to data contention on the shared I/O data connection and in the queue of the master 120.

In one embodiment, the master 120 further includes a delay mimic 630 within an internal data MSP 417 and delay logic 620. As described in greater detail below, the delay mimic 630 and the delay logic 620 comprise synchronization circuitry configured to determine and reduce the timing skew between the master 120 and the slave 130. Persons skilled in the art will recognize that, in different embodiments, the delay mimic 630 and the delay logic 620 may be implemented in other locations with respect to the data flow illustrated in FIG. 6.

Figure 7:
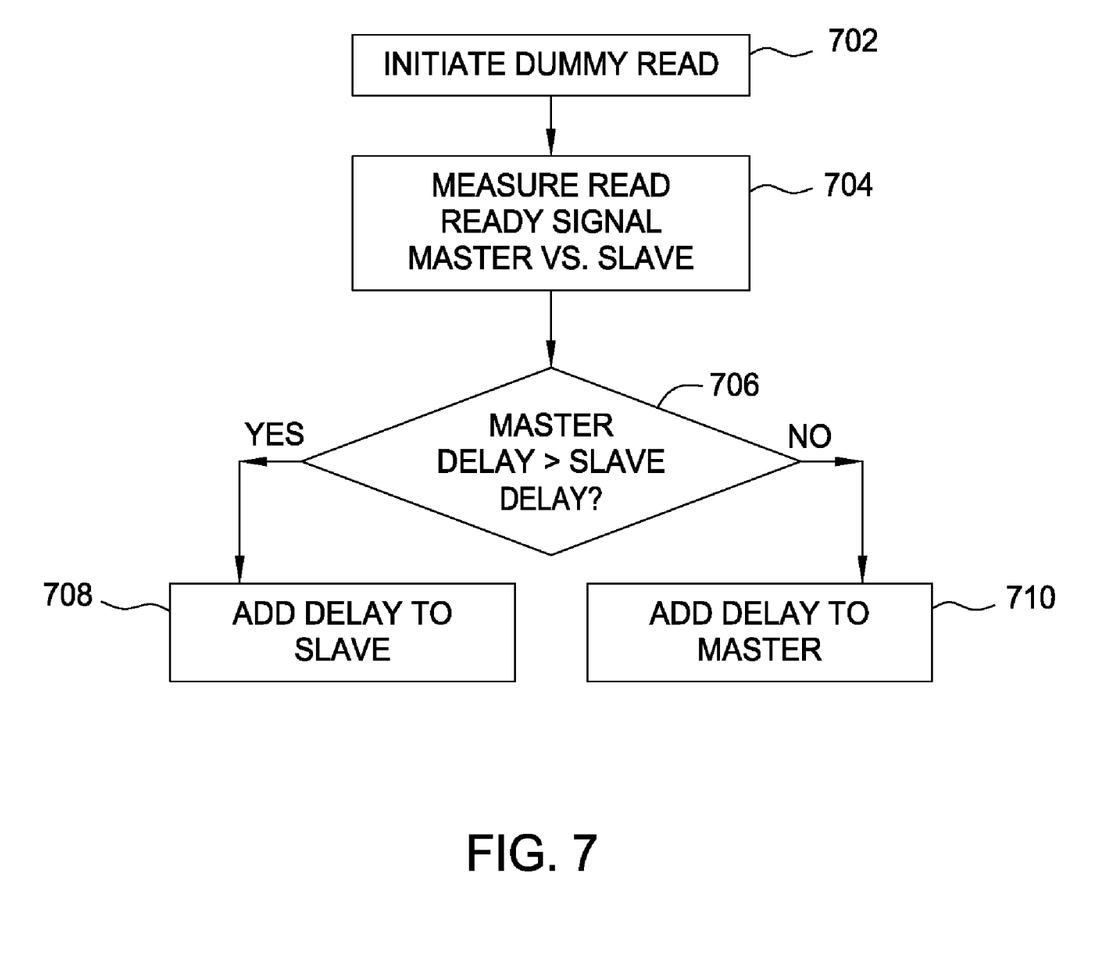
FIG. 7 is a flow diagram depicting a method for synchronizing a master and a slave in a memory enabled system with master-slave architecture according to one embodiment of the invention.

FIG. 7 sets forth a method for synchronizing the master 120 and the slave 130 in a memory enabled system with master-slave architecture, in accordance with embodiments of the invention. Although the method steps are described in conjunction with the master 120 and the slave 130 described in FIG. 6, persons skilled in the art will recognize that any system that performs the method steps, in any order, is within the scope of the invention.

Figure 8:
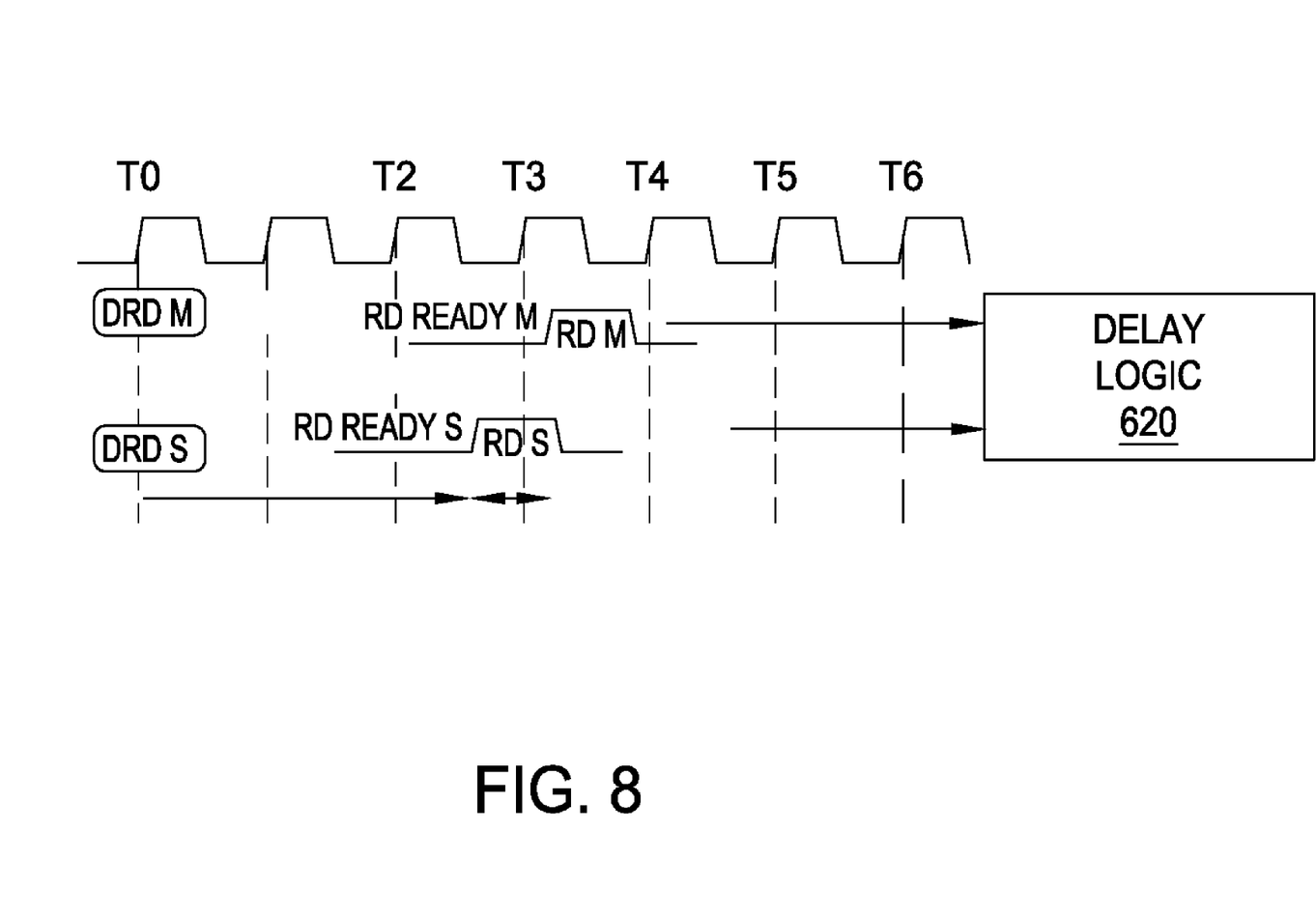
FIG. 8 is a timing diagram illustrating how the timing skew for a READ operation may be measured using a dummy READ command, according to one embodiment of the invention.

The method begins at step 702, where the memory controller 110 initiates a dummy READ command, shown as "DRD M" in FIG. 8, to the master 120 and a dummy READ command, shown as "DRD S" in FIG. 8, to the slave 130. FIG. 8 illustrates how the timing skew for a READ operation may be measured using a dummy READ command, according to one embodiment of the invention.

Referring back now to FIG. 6, as the master 120 processes the READ command DRD M, the data flow traverses the control logic and address register unit 411, the column address decoder 413, the row address decoder 414, the memory array 415, and the I/O gating unit 416. As the slave 130 processes the READ command DRD S, the data flow traverses the column address decoder 423, the row address decoder 424, the memory array 425, and the I/O gating unit 426. Note that the data flow bypasses the control logic and address register unit 421 and the READ/WRITE logic 428 of the slave 130 because the slave 130 shares corresponding resources of the master 120, i.e., the control logic and address register unit 411 and the READ/WRITE logic 418.

In step 704, the delay logic 620 measures a READ READY signal asserted by the master 120 in response to the dummy read command DRD M, shown as "RD READY M" in FIG. 8, and a READ READY signal, asserted by the slave 130 in response to the dummy read command DRD S, shown as "RD READY S" in FIG. 8. In step 706, the delay logic 620 computes the access delay for the master 120, MASTER DELAY, and for the slave 130, SLAVE DELAY, and determines whether MASTER DELAY is greater than SLAVE DELAY. In one embodiment, the access delays may be determined as described above. If the delay logic 620 determines that MASTER DELAY is greater than SLAVE DELAY, then the slave 130 is faster relative to the master 120, and the method proceeds to step 708. In step 708, the delay logic 620 adds a delta delay to the slave 130, which is a timing delay intended to adjust the READ timing to the slowest of the two memory devices. The exact value of the delta delay added to the slave 130 should be such that the difference between the access delay for the master 120 and the access delay for the slave 130 becomes less than a maximum acceptable predetermined time value. In one embodiment, the delay logic 620 may instruct the delay mimic 630 to add the delta delay to the READ path of the slave 130. In another embodiment, the delay logic 620 may instruct the READ/WRITE logic 418 to add the delta delay to the FIFO entries received from the slave 130.

If, however, in step 706, the delay logic 620 determines that the access delay for the slave 130 is greater than the access delay for the master 120, then the master 120 is faster relative to the slave 130, and the method proceeds to step 710. In step 710, the delay logic 620 adds a delta delay to the master 120. Again, the exact value of the delta delay added to the master 120 should be such that the difference between the access delay for the master 120 and the access delay for the slave 130 becomes less than an acceptable predetermined time value. In one embodiment, the delay logic 620 may instruct the delay mimic 630 to add the delta delay to the READ path of the master 120. In another embodiment, the delay logic 620 may instruct the READ/WRITE logic 418 to add the delta delay to the FIFO entries received from the master 120.

The method steps described above allow determining the difference in the access delays of the two memory devices, the master 120 and the slave 130, and adjusting READ timing to the slowest of the two memory devices. In one embodiment, these method steps may be performed once, when the memory enabled system is configured initially. In another embodiment, these method steps may be performed each time the memory enabled system is powered on or reset. In yet another embodiment, these method steps may be performed periodically. Such a synchronization scheme between the master 120 and the slave 130 eliminates the timing skew on the data bus due to PVT variations between the master 120 and the slave 130, thereby avoiding the problems of data contention on the data bus.

In another embodiment, the method above may be implemented with respect to commands and data processed by the master 120 and the slave 130 to eliminate the timing skew on the C/A bus. For example, where the master 120 is faster than the slave 130, command signals issued to the master 120 may be delayed with respect to those provided to the slave 130, thereby eliminating any skew between the master 120 and the slave 130. Similarly, where the slave 130 is faster than the master 120, command signals issued to the slave 130 may be delayed with respect to those issued to the master 120, thereby eliminating any resulting skew. As a result, high speed operation may be achieved without the need of multiple command, address and data bus lines.

While the foregoing is directed to embodiments of the present invention, other and further embodiments of the invention may be devised without departing from the basic scope thereof, and the scope thereof is determined by the claims that follow.

What is claimed is:

1. A system, comprising:
   a memory controller configured to issue a first command to a first memory device and a second command to a second memory device;
   the first memory device comprising first logic, and configured to:
      receive the first command issued to the first memory device,
      receive the second command issued to the second memory device,
      process the first command and the second command using the first logic of the first memory device, wherein the first logic includes command decoding logic and first read/write logic that communicates data between the first memory device and the memory controller, and
      initiate a communications exchange between the first memory device and the second memory device based on the second command;
   the second memory device comprising second logic including command decoding logic and second read/write logic, whereby the second logic is bypassed for purposes of processing the second command by the first logic of the first memory device; and
   synchronization circuitry configured to:
      determine a first time difference for the first memory device as a difference between the time when the first memory device receives the first command and the time when the first memory device asserts a first ready signal indicating the first memory device has data ready for output to the first read/write logic,
      determine a second time difference for the second memory device as a difference between the time when the second memory device receives the second command and the time when the second memory device asserts a second ready signal indicating the second memory device has data ready for output to the first read/write logic,
      determine a timing skew between the first memory device and the second memory device based on the first time difference and the second time difference, and
      introduce a delta time difference to at least one of the first ready signal and the second ready signal, wherein the delta time difference adjusts the timing skew.

2. The system of claim 1, wherein the command decoding logic of the first memory device is adapted to decode the first and the second commands, and the first read/write logic of the first memory device includes a first-in-first-out (FIFO) buffer to store data received from the first memory device and the second memory device.

3. The system of claim 1, wherein the delta time difference adjusts the timing skew relative to a predetermined value.

4. The system of claim 1, wherein the timing skew is a difference between the first time difference and the second time difference.

5. The system of claim 1, wherein the synchronization circuitry introduces the delta time difference to a read path of the one of the first memory device and the second memory device.

6. The system of claim 1, wherein the synchronization circuitry introduces the delta time difference to queue entries of the one of the first memory device and the second memory device.

7. The system of claim 1, wherein the synchronization circuitry introduces the delta time difference to the first memory device when the second time difference is greater than the first time difference, and introduces the delta delay to the second memory device otherwise.

8. The system of claim 1, wherein the synchronization circuitry is included within the first memory device.

9. The system of claim 1, wherein the first memory device and the second memory device are components of a multi-chip package.

10. A method of synchronizing a memory enabled system, comprising:
    receiving, at a first memory device, a first command issued to a first memory device comprising first logic; the first logic comprising command decoding logic and first read/write logic that is adapted to communicate data between the first memory device and the memory controller;
    receiving, at the first memory device, a second command issued to a second memory device comprising second logic; the second logic comprising command decoding logic and second read/write logic that communicates data between the second memory device and the memory controller;
    processing the first command and the second command using the first logic of the first memory device, whereby the second logic of the second memory device is bypassed for purposes of processing the second command;
    based on the first command, determining a first time difference for the first memory device as a difference between the time when the first memory device receives the first command and the time when the first memory device asserts a first ready signal indicating the first memory device has data ready for output to the first read/write logic;
    based on the second command:
       initiating a communications exchange between the first memory device and the second memory device; and
       determining a second time difference for the second memory device as a difference between the time when the second memory device receives the second command and the time when the second memory device asserts a second ready signal indicating the second memory device has data ready for output to the first read/write logic;
    based on the first time difference and the second time difference, determining a timing skew between the first memory device and the second memory device; and introducing a delta time difference to at least one of the first ready signal and the second ready signal, wherein the delta time difference adjusts the timing skew.

11. The method of claim 10, wherein the first and the second commands are issued by a memory controller; and wherein the command decoding logic of the first memory device is adapted to decode the first and the second commands, and the first read/write logic of the first memory device includes a first-in-first-out buffer to store data received from the first memory device and the second memory device.

12. The method of claim 10, wherein the delta time difference adjusts the timing skew relative to a predetermined value.

13. The method of claim 10, wherein the first memory device and the second memory device are components of a multi-chip package.

14. The method of claim 10, wherein the first and the second commands are READ commands.

15. The method of claim 10, wherein the timing skew is a difference between the first time difference and the second time difference.

16. The method of claim 10, wherein the delta time difference is introduced to a read path of the one of the first memory device and the second memory device.

17. The method of claim 10, wherein the delta time difference is introduced to queue entries of the one of the first memory device and the second memory device.

18. The method of claim 10, wherein the delta time difference is introduced to the first memory device when the second time difference is greater than the first time difference, and the delta time difference is introduced to the second memory device otherwise.

19. A method for operating a memory enabled system, comprising:
performing a synchronization operation between a first memory device and a second memory device, the synchronization operation comprising:
determining a first time difference of the first memory device on the basis of a first command decoded by the first memory device, whereby the first time difference is determined as a difference between the time when the first memory device receives a first command and the time when the first memory device asserts a first ready signal indicating the first memory device has data ready for output,
determining a second time difference of the second memory device on the basis of a second command decoded by the first memory device and then provided as a decoded command to the second memory device, whereby command decoding logic of the second memory device is bypassed and the second time difference is determined as a difference between the time when the second memory device receives the decoded command and the time when the second memory device asserts a second ready signal indicating the second memory device has data ready for output,
determining a timing skew between the first memory device and the second memory device based on the first and second time differences, and
introducing a delta time difference to at least one of the first ready signal and the second ready signal, wherein the delta time difference adjusts the timing skew; and
performing memory accesses of the first and second memory devices, the memory accesses comprising:
receiving commands, addresses, and data from a memory controller via a first port of the first memory device,
decoding the commands from the memory controller to produce decoded commands,
latching the addresses and the data from the memory controller to produce latched addresses and latched data,
providing the decoded commands, the latched addresses, and the latched data to the second memory device via a second port of the first memory device, and
based on the decoded commands, the latched addresses, and the latched data, accessing one of a memory array of the first memory device and a memory array of the second memory device.

20. The method of claim 19, wherein one of the decoded commands is a read command, and, in response to receiving a decoded read command from the first memory device, the second memory device outputs read data from the memory array of the second memory device via a second port of the second memory device.

21. The method of claim 19, further comprising receiving an additional address bit from the memory controller and, based on the additional address bit, determining whether the decoded commands, the latched addresses, and the latched data should be outputted via the second port of the first memory device.

22. The method of claim 19, further comprising placing the latched data in a data queue before outputting the latched data via the second port of the first memory device.

23. The method of claim 19, wherein the delta time difference is introduced to the one of the first memory device and the second memory device periodically, when the memory enabled system is configured initially, or each time the memory enabled system is powered or reset.

24. A system, comprising:
a master memory device, comprising:
a first interface configured to receive commands and addresses and bi-directionally communicate data,
first command decoding logic to decode the received commands to produce decoded commands, and
first read/write logic to communicate data between the master memory device and a memory controller;
a slave memory device, comprising:
a second interface configured to receive commands and addresses and bi-directionally communicate data, wherein the second interface is bypassed during operation,
second command decoding logic, and
second read/write logic to communicate data between the slave memory device and the memory controller;
synchronization circuitry configured to:
determine a master time difference for the master memory device as a difference between the time when the master memory device receives a first command and the time when the master memory device asserts a master ready signal indicating the master memory device has data ready for output to the first read/write logic,
determine a slave time difference for the slave memory device as a difference between the time when the slave memory device receives a second command and the time when the slave memory device asserts a slave ready signal indicating the second memory device has data ready for output to the first read/write logic,
determine a timing skew between the master memory device and the slave memory device based on the master time difference and the slave time difference, and introduce a delta time difference to at least one of the master ready signal and the slave ready signal, wherein the delta time difference adjusts the timing skew;

a data bus connecting the master memory device and the slave memory device in a manner allowing the slave memory device to utilize the first read/write logic and to bypass the second read/write logic; and a command/address bus connecting the master memory device and the slave memory device in a manner allowing the slave memory device to receive a portion of the decoded commands from the master memory device and to bypass the second command decoding logic.

25. The system of claim 24, wherein the synchronization circuitry is a part of the master memory device.

* * * * *